(12) United States Patent
Lane et al.

(10) Patent No.: US 6,599,619 B1
(45) Date of Patent: *Jul. 29, 2003

(54) MICROWAVE TRANSPARENT THERMOSETTING RESIN COMPOSITIONS, ELECTRICAL LAMINATES OBTAINED THEREFROM, AND PROCESS OF PRODUCING THESE

(75) Inventors: Scott A. Lane, Eads, TN (US); Donald C. Rollen, Collierville, TN (US); Timothy W. Austill, Cordora, TN (US)

(73) Assignee: GIL Technologies, a division of the Alpha Corporation, Collierville, TN (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/984,157

(22) Filed: Dec. 3, 1997

Related U.S. Application Data

(60) Provisional application No. 60/032,288, filed on Dec. 3, 1996.

(51) Int. Cl.$^7$ .................. B32B 27/40; B32B 15/08
(52) U.S. Cl. ............... 428/220; 428/425.6; 428/425.8; 428/441; 428/458; 428/461; 428/462; 428/463
(58) Field of Search ................ 428/219, 220, 428/425.6, 425.8, 441, 458, 461, 462, 463

(56) References Cited

U.S. PATENT DOCUMENTS 4,243,788 A * 1/1981 Kuehn .................. 526/261
4,803,022 A * 2/1989 Barrell et al. ............ 264/25

* cited by examiner

*Primary Examiner*—D. S. Nakarani
(74) *Attorney, Agent, or Firm*—Venable, LLP; Marina V. Schneller

(57) ABSTRACT

The present invention relates to a thermosetting resin composition with excellent electrical properties comprising (a) one or more terminally unsaturated urethane resins, (b) styrene, and (c) brominated styrene. The aforementioned composition finds great utility as a printed circuit board laminate suitable for use at microwave frequencies.

12 Claims, 1 Drawing Sheet

MICROWAVE TRANSPARENT THERMOSETTING RESIN COMPOSITIONS, ELECTRICAL LAMINATES OBTAINED THEREFROM, AND PROCESS OF PRODUCING THESE

This is a regular application based on Provisional Application No. 60/032,288 filed Dec. 3, 1996 and pursuant to 37 C.F.R. 1.53(b) this application claims the benefit of the filing date of same. The entire specification of Provisional Application No. 60/032,288 is herein incorporated by reference.

BACKGROUND OF THE INVENTION

1. Field of the Invention

The present invention relates to thermosetting resin compositions with excellent electrical properties; electrical laminates made therefrom; and methods of producing these.

2. Background of the Invention

All publications and patent applications herein are incorporated by reference to the same extent as if each individual publication or patent application was specifically and individually indicated to be incorporated by reference.

Electrical laminates such as circuit boards are produced by laminating sheets of electrical conducting material onto a base substrate of insulation material. The performance of the finished circuit board is effected by the electrical characteristics of the base substrate material.

Commercially available thermoset resin systems with acceptable electrical performance at high frequencies (>350 MHZ) are restricted in their applications due to high cost. The lower cost alternatives that are available do not perform satisfactorily at high frequencies due to unacceptable electrical properties, such as high dielectric constant ($D_k$), high dissipation factor ($D_f$), high variability of $D_k$ and $D_f$ with frequency, and consistency of $D_k$ and $D_f$ from lot to lot of production material.

Thermoplastic polymers such as polytetrafluoroethylene (PTFE) which have exceptional electrical performance at high frequencies are commercially available. The primary drawbacks associated with these materials are very high raw material costs and special processing considerations that add substantial cost to the final product. Because of the physical properties, very high laminating temperatures and pressures are also required to fabricate an electrical laminate from PTFE. Furthermore, due to the inability to "wet" PTFE, costly and hazardous chemicals are required to modify its surface during fabrication of the circuit.

A thermoset material would have much greater mechanical properties over a much broader temperature range. Additionally, since thermoset materials have better mechanical properties, this would allow the circuit board fabricator to use conventional cost effective processes.

A need exists for thermosetting resin compositions, and electrical laminates made therefrom, of low to moderate cost with acceptable electrical properties at frequencies up to at least 20 GHz. Such compositions would have great utility as circuit board substrates and the laminates made from these thermosetting resins can be utilized in many applications such as in the rapidly growing wireless communication market, in high speed computers, in high definition televisions, and in various other electrical and related applications.

SUMMARY OF THE INVENTION

An object of the present invention is to provide a thermosetting resin composition which can be made flame retardant and which can be utilized in existing cost effective technologies to manufacture electrical laminates therefrom. Additionally, the present invention resin compositions can have utility as, for example, electrical insulators, encapsulants, insulating adhesives and in various other electrical and related applications generally know to those skilled in this art.

Accordingly, the present invention provides a thermosetting resin composition comprising (a) a terminally unsaturated urethane resin selected from the group of 1):

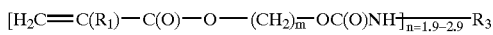

where $R_1$ is H or $CH_3$, m is 2 or 3, and $R_3$ is an organic residue from a diisocyanate; and 2):

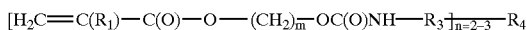

where $R_1$ is H or $CH_3$, m is 2 or 3, $R_3$ is an organic residue from a diisocyanate, and R4 is an isocyanurate compound of the following structure;

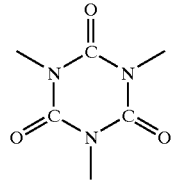

and (b) an ethylenically unsaturated monomer from the group of 1) styrene and 2) bromostyrene with the following structures:

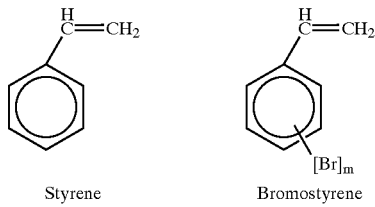

Styrene      Bromostyrene where m=1 to 3.

Additionally, to achieve the desired properties (i.e., microwave transparency, fire retardation, and good thermal performance) the ratio of (a) to the sum of (b)1 and (b)2) is less than 0.15, and the ratio of (b)1) to (b)2) is less than 1.2.

The composition resins may also further contain monomers which would, for example, aid in the adhesion of a metal foil to the laminate; increase crosslink density and thermal performance; etc. Catalysts which, for example, induce free-radical cure may also be added. Other components may include moisture scavengers, compounds which increase or reduce the dielectric constant, and/or reduce the dissipation factor, polyethylene fillers, other fillers, organic or inorganic, which modify rheology, surface agents, viscosity and performance modifiers, wetting agents, air release agents, defoaming agents, flame retardant synergists, adhesion promoters, and other additional monomers and conventional additives known in the art.

Other objects of the present invention are to provide electrical laminates, and methods for producing these laminates containing the composition resins of the present invention, which have excellent electrical properties and which may be flame retardant or heat resistant. Accordingly, the present invention further provides electrical laminates from about 0.003 inches to about 0.120 inches thick which may or may not be clad with an electrical conducting material on one or both sides.

The electrical laminates of the present invention are produced by (a) continuous lamination or (b) a batch process:

(a) The compositions of the present invention are uniquely suitable to the continuous lamination methods of Barrel et al. (U.S. Pat. Nos. 4,587,161 and 4,803,022). The combination of materials in the outlined ratios provides lower viscosities then previous compositions, (U.S. Pat. Nos. 4,420,509 and 4,446,173). Lower viscosities provide more rapid impregnation of reinforcements to allow higher line-speeds and consequently higher machine output. In the continuous lamination process, the desired composition is formulated with a free-radical source, (i.e., peroxide, azo-compound, etc.) to initiate cure. Optionally, the material is postcured in a batch convection oven to further lower the dissipation factor of the laminate. Therefore, we have found the combination of continuous lamination with additional batch cure provides unexpected improvements in electrical performance. While the continuous lamination temperatures and times are known in the art, we have found the optimum secondary batch oven cure profile to be 350° F. for 1 hour dwell, (or range from 150° F. for 3 hours to 450° F. for 30 minutes).

(b) The method to manufacture the laminate with a batch process involves

1) A layer of carrier film, such as polyethylene terephthalate of 1.42 mills thick, was placed on a ¼th inch thick glass plate of 1.25 by 1.25 ft. The dimensions of the film were large enough to protrude around the edges of the glass plate.

2) A one foot square piece of 1 oz. per sq. foot weight of copper foil was placed treatment side up on the carrier film.

3) A film of a resin composition, prepared according to the present invention, was metered onto the copper foil by using a wire-wound rod designed to provide a coating of the target thickness of the laminate. Wire-wound rods are well known throughout the coatings industry.

4) A layer of glass cloth, woven or nonwoven, was laid onto the resin film and allowed to saturate for approximately 2 minutes. If a plurality of layers were used, the layers were placed onto the resin film approximately 2 minutes apart to allow the resin mixture to saturate the glass.

5) An additional layer of copper foil, of the same size and weight as 2), was placed treatment side down on the laminate so as to align the edges with the first sheet of copper foil.

6) Another layer of carrier film, of the same size and dimensions as 1), was placed on top of the copper foil.

7) Two ½ inch wide by 12 inches long shims of the target laminate thickness were placed on opposing sides of the laminate, on top of the carrier film, but still on the glass plate.

8) A rod of ½ inch thick steel was placed on the shims at one edge of the laminate and gently pulled to the opposing edge while being forced by hand to ride on the shims. As the rod moved across the laminate, excess resin composition was allowed to drain out of the laminate.

9) Another plate of glass of equivalent dimensions as 1), was placed on top of the laminate.

10) The laminate was placed in a forced air convection oven at 150–250° F. for 15 minutes to 1 hour.

11) The laminate, still between the glass plates, was removed from the oven and allowed to cool to room temperature. At this time, the two glass plates and two layers of carrier film were removed.

12) Post cure from 350° F. for 1 hour in a forced air convention oven.

The thermosetting resin composition may also further contain the above mentioned added components and may be cured by electron beam processing, radiation, heat with or without pressure, ultra violet light processing, and other conventional curing methods in conjunction with the appropriate initiators. The electrical laminates may further comprise an electrical conductive cladding on at least one side.

One skilled in the art can easily make any necessary adjustments in accordance with the necessities of the particular situation.

Further objects and advantages of the present invention will be clear from the description that follows.

DETAILED DESCRIPTION OF THE INVENTION

Figure 1:
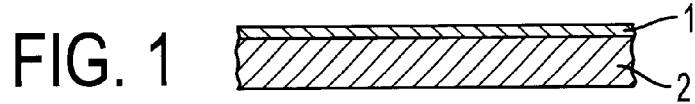
FIG. 1 is an enlarged cross-sectional view of a part of an electrical laminate which comprises an electrically conductive metal layer 1 and a cross linked thin-wall body of the invented composition 2.
Figure 2:
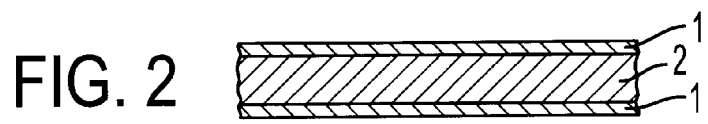
FIG. 2 is an enlarged cross-sectional view of an electrical laminate which exemplifies a double-sided metal clad electrical laminate, further provided with two metal conductive layers 1, and an electrically insulating thin-wall body of the invented composition 2.
Figure 3:
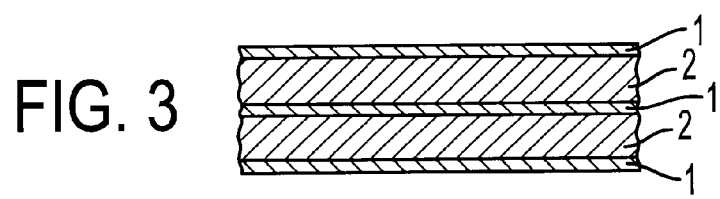
FIG. 3 is an enlarged cross-sectional view of an electrical laminate which exemplifies a multilayered electrical laminate, of the structure of a combination of single-sided and double sided metal clad electrical laminates as illustrated in FIG. 1 and FIG. 2.
Figure 4:
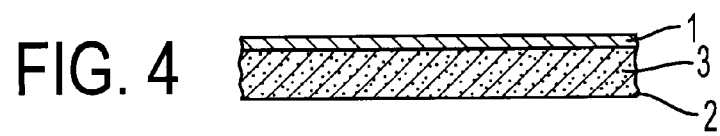
FIG. 4 is an enlarged cross-sectional view of an electrical laminate which comprises an electrically conductive layer 1, a crosslinked thin-wall body of the invented composition 2, and an uniformly dispersed inorganic or organic filler 3.
Figure 5:
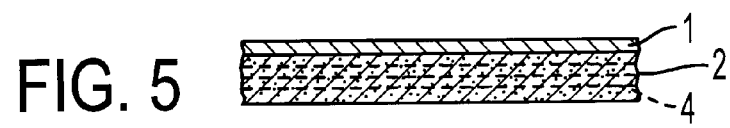
FIG. 5 is an enlarged cross-sectional view of an electrical laminate which comprises an electrically conductive metal layer 1, a crosslinked thin-wall body of invented composition 2, and nonwoven glass fibers 4.
Figure 6:
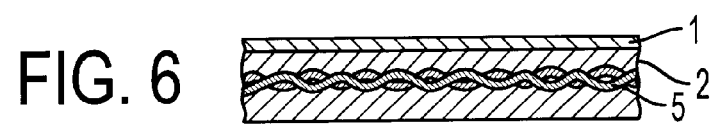
FIG. 6 is an enlarged cross-sectional view of an electrical laminate which comprises an electrically conductive metal layer 1, a crosslinked thin-wall body of invented composition 2, and woven glass cloth 5.
Figure 7:
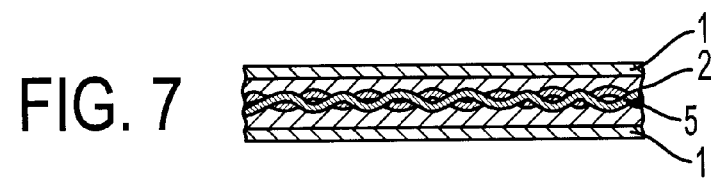
FIG. 7 is an enlarged cross-section view of part of an example of a double-sided metal clad electrical laminate of FIG. 6 further provided with an electrically conductive metal layer 1 on the other surface.
Figure 8:
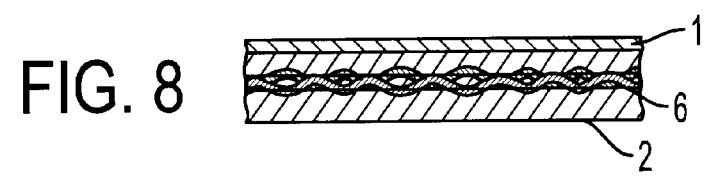
FIG. 8 is an enlarged cross-sectional view of an electrical laminate which comprises an electrically conductive metal layer 1, a crosslinked thin-wall body of the invented composition 2, and an aramid non-woven sheet 6.

Unless defined otherwise, all technical and scientific terms used herein have the same meaning as comnmonly understood by one of ordinary skill in the art to which this invention belongs. Although any methods and materials similar or equivalent to those described herein can be used in the practice or testing of the present invention the preferred methods and materials are described.

The present invention comprises resin compositions of moderate cost with excellent electrical properties up to at least 20 GHz which may be flame retardant and heat resistant. The present compositions have utility as electrical insulators, electrical laminates, electrically insulating encapsulates, electrically insulating adhesives and other electrical and related applications. One component of these compositions is a terminally unsaturated urethane resin, known in the industry as a urethane vinyl ester:

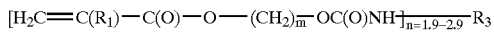

where $R_1$ is H or $CH_3$, m is 2 or 3, and $R_3$ is an organic residue from a diisocyanate. This resin is manufactured by reacting a diisocyanate. This resin is manufactured by reacting a diisocyanate with two molar equivalents of monohydric alcohol containing a vinylidene group in the presence of a polar solvent (typically styrene) which also acts as a reactive monomer for crosslinking. Examples of this art are well known throughout the industry. The diisocyanate utilized may be aromatic or aliphatic, monomeric or polymeric, etc. The only requirements are that the diisocyanate contain isocyanate groups capable of reacting with the monohydric alcohol and not interfere with the subsequent crosslinking reactions. Examples of the diisocyanate are 2,4 toluene diisocyanate, 2,6 toluene diisocyanate, 2,4'-diphenylmethane diisocyanate, and 2,6'-diphenyl methane diisocyanate. Examples of the monohydric alcohol that contains a vinylidene group are hydroxyethyl methacrylate, hydroxyethyl acrylate, hydroxypropyl methacrylate, and hydroxypropyl acrylate.

Another component of these compositions is a terminally unsaturated urethane resin, known in the industry as an isocyanurate vinyl ester:

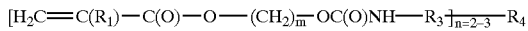

where $R_1$ is H or $CH_3$, m is 2 or 3, $R_3$ is an organic residue from a diisocyanate, and R4 is an isocyanurate compound of the following structure;

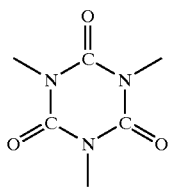

This resin is manufactured by the methods of Kuehn et al. (U.S. Pat. Nos. 4,145,544 and 4,243,788). For examples of these resins refer to the aforementioned patents.

It has been found that a combination of one or more of these resins with styrene and dibromostyrene in certain ratios will yield a composition with excellent properties suitable as a matrix resin for high frequency electrical application. The main embodiment thereof, is a printed circuit board laminate suitable for microwave antennas and the like. The preferred ratio for terminally unsaturated urethane resin to ethylenically unsaturated monomer has been determined to be less than 0.15. Or in the case where 1 mole of 2,4'-toluene diisocyanate is reacted with 2 moles of hydroxylpropyl methacrylate, less than 27% by weight of this resin (without monomer) is desired in ethylenically unsaturated monomer. In the case where an isocyanurate vinyl ester is manufactured from the same materials in different ratios, less than about 35% by weight of resin (without monomer) is desired in ethylenically unsaturated monomer.

One skilled in the art can readily obtain the aforementioned ratios from molecular weight and weight percent information. Examples 2 & 3 of TABLE 1 contain a urethane modified vinyl ester with a molecular weight of approximately 4200, styrene monomer of molecular weight 104.15, and dibromostyrene of average molecular weight 263.95. Using this information, the ratios of urethane modified vinyl ester to total monomer would be 0.01 and 0.02 for Examples 2 & 3 respectively. Additionally, the ratio of styrene to dibromostyrene would be 0.50, and 1.16 for Examples 2 & 3 respectively.

The second main component of these compositions is an ethylenically unsaturated monomer from the group of 1) styrene and 2) bromostyrene. Examples of bromostyrene include monobromostyrene, dibromostyrene, and tribromostyrene. Additionally, the ideal molar ratio of styrene to bromostyrene has been found to be less than 1.2. Maintaining the desired ratios provides a composition with excellent electrical properties at microwave frequencies along with desirable thermal and mechanical properties.

An optional component may be divinyl benzene (referred herein as DVB), or any other ethylenically multiunsaturated monomer. DVB can be about 0.1% to about 10% by weight; preferably about 0.5% to about 5% by weight of the total composition; more preferably about 1% to about 4% by weight of the total composition and most preferably about 2.5% by weight of the total composition. Divinyl benzene increases the crosslink density and therefore thermal performance of the composition. Other polyfunctional crosslinking monomers may also be use such as divinyl toluene and the like.

The third and fourth components contribute to the mechanical and thermal properties of a composition but do not need to be present to obtain the excellent electrical properties.

Catalysts and polymerization and U.V. initiators may also be components of the compositions of the present invention. There are many choices available; particularly, catalyst which induce free-radical cure. The preferred catalyst is t-butyl peroctoate at about 0.1 to about 2% by weight of the total composition (preferably about 0.2% by weight of the total composition); benzoate at about 0.1 to about 2% by weight of the total composition (preferably 0.25% by weight of the total. Alternate catalysts include benzoyl peroxide, cumene hydrogen peroxide and others known to those skilled in this art. Combination of catalysts may also be used. Curing mechanisms may be utilized including electron beam processing and ultra-violet light processing in conjunction with UV initiators, radiation, heating with or without pressure, and other conventional curing methods in conjunction with the appropriate initiators.

Additional components, such as moisture scavengers may also be added. Free moisture in the composition will negatively affect the dissipation factor. Therefore a component, such as 3-ethyl-2-methyl-2-(3-methylbutyl)-1,3-oxazolidine (available from Angus Chemical Co.) can be added to minimize the free water in the composition. The oxazolidine compound will chemically react with the water to eliminate it. Alternately, a molecular sieve could be utilized. Molecular sieves are well known as moisture reducers throughout the coatings industry. Molecular sieves function by physically trapping the free water.

Another additional component may be titanium dioxide which increases the dielectric constant, but reduces the dissipation factor. This combination of electrical properties is desirable for some specific high frequency applications. The titanium dioxide may be in a range of from about 1 to about 60% by weight of the total composition; preferably about 10 to about 40% by weight of the total composition; more preferably about 25% by weight of the total composition.

Another component which may be added is polyethylene filler, (such as expanded polyethylene compound, available from American Fillers and Abrasives). The polyethylene will lower both the dielectric constant and dissipation factor. The polyethylene may be in a range of from about 1 to about 60% by weight of the total composition; preferably about 5 to about 40% by weight of the total composition; more preferably about 10% by weight of the total composition.

Other optional additives include organic and/or inorganic fillers, for example, calcined kaolin, to modify rheology; surface active agents, to aid processing; other monomers, such as methyl methacrylate to modify viscosity and possibly performance; epoxies; colorants; fluorescent dyes; U.V. blocking agents; wetting agents; air release agents; defoaming agents; flame retardant synergists (for example, antimony compounds); adhesion promoters (for example, epoxy resin "EPON 828" Shell Chemical Co.); additional monomers including styrene, vinyl toluene, t-butyl styrene, paramethyl styrene, diallyl phthalate, 2,4-ethyl-methyl imidazole, and other conventional additives.

The present invention further comprises electrical laminates utilizing the thermosetting resin compositions herein described which have excellent electrical properties and which may be flame retardant and heat resistant. The present thermosetting resin compositions can also be utilized in existing cost effective technologies to manufacture various types of electrical laminates. Examples of these technologies include, but are not limited to, continuous lamination, such as that described in U.S. Pat. No. 4,803,022 to Barell et al. which is incorporated herein by reference; production of printed circuit boards, such as described in U.S. Pat. Nos. 4,671,984 and 4,751,146 to Masahiko Maeda et al. which are incorporated herein by reference; production of electrical laminates such as described in U.S. Pat. No. 4,336,297 to Yasuo Fushiki et al. and U.S. Pat. No. 5,009,949 to Kazuyuki Tanaka et al. which are both incorporated herein by reference; continuous belt press lamination, such as the equipment offered by GreCon Corp.; and traditional press or vacuum press lamination.

An electrical laminate of the present invention is produced by infiltrating or impregnating at least one substrate, or multiple substrates, with a resin composition of the present invention to prepare resin-infiltrated or resin-impregnated substrates which are laminated by passage between rolls while removing interlaminar gas bubbles. Subsequently, the resulting laminate is heated, with or without pressure, to cure the resin composition whereby the electrical laminate is obtained. Other cure mechanisms can also be utilized. The electrical laminate of this invention can be continuously produced.

For curing the resin composition, organic peroxides can be used as curing catalysts. The organic peroxides include, for example, t-butyl perbenzoate, t-butyl peroxide, benzoyl peroxide, t-butyl peroctoate, t-butyl peroxy benzoate, dicumyl peroxide, etc. If necessary, the curing can be controlled by use of curing accelerators or polymerization inhibitors. Characteristics of the resin composition can be improved by incorporating therein to plasticizers, stabilizers, thickeners, fillers, coloring agents, lubricants, etc.

A copper-clad laminate can be obtained by subjecting substrates impregnated with an uncured resin composition and copper foil to laminated molding to unite them in a body, or by inserting an adhesive between substrates impregnated with an uncured resin and copper foil and then subjecting them to laminated molding to unite them in a body. A copper-clad laminate can be obtained by also preparing a laminate by laminate molding and then unite this laminate and a copper foil laminate in a body through an adhesive. Adhesives such as epoxy resins, butyryl-modified epoxy resins, etc. can be used.

The present electrical laminates may be from about 0.001 to about 0.25 inches thick and may be metal clad on one or both sides or not clad in metal. A preferred embodiment is about 0.002 to about 0.20 inches thick. A more preferred embodiment is about 0.003 to about 0.120 inches thick.

Suitable cladding metals include aluminum, silver, gold, brass and most preferably copper. The metal cladding may be in various forms and weight. The weight may range from about 0.25 to about 5 oz/ft$^2$. The form can be any conventional type, such as, foil, an electrodeposited layer or rolled annealed metal, such as for example, rolled annealed copper.

A preferred embodiment comprises a copper clad electrical laminate suitable for subsequent processing as a circuit board, stripline, microstripline microwave components and other related applications. The preferred embodiment of this composition is an electrical laminate from 0.003 to 0.120 inches thick with metal foil clad on one or both sides.

Suitable reinforcement components include organic or inorganic fillers, woven fiberglass, glass paper, glass mat, glass cloth, polyimide paper (such as "THERMOUNT" from DuPont), woven polymeric fibers and non-woven polymer fiber reinforcements and the like. The reinforcement components of the laminates of the present invention may be in the range of about 25% to 75% by weight of the total laminate, preferably about 30% to about 40%, and more preferably about 35%.

The performance of this composition differs from similar materials mainly in electrical performance. These properties, especially dissipation factor, are very important when considering high frequency applications. Typical electrical properties of an 0.030" thick laminate of approximate 20% (by weight) of fiberglass reinforcement are:

| Frequency (GHz): | 2.5 | 10.0 |
|---|---|---|
| Dielectric constant: | 3.20 | 3.22 |
| Dissipation factor: | 0.0031 | 0.0048 |

The electrical properties of the same laminate at 1 MHZ are:

| Dielectric constant: | 3.20 |
|---|---|
| Dissipation factor: | 0.0029 |

The above data shows the consistency of the dielectric constant and dissipation factor of a laminate comprising the inventive compositions across a wide range of frequencies. This feature is highly desirable for compositions utilized as dielectric materials.

This embodiment of the present invention is clearly superior in electrical properties over presently available compositions.

The invention will be further clarified by a consideration of the following examples which are to be considered as illustrative of the present invention. It should be understood that the invention is not limited to the specific details of the examples.

EXAMPLES

The unsaturated urethane resins are manufactured according to U.S. Pat. Nos. 4,587,161 and 4,803,022 of Kuehn et al., manufactured according to methods known in the art, or commercially available as Palatal 48001 KR (BASF, Germany) or 580-05 (Reichold Chemicals Inc., USA) in the case of a urethane vinyl ester, and as ITP 1041 and ITP 1070 (Reichold Chemicals Inc., USA), in the case of a isocyanurate vinyl ester. The ethylenically unsaturated monomers styrene and dibromonostyrene are commercially available.

The general method of preparing the resin compositions is as follows.

1) The ingredients, (listed in TABLE 1), are added to a mixing vessel.

2) The ingredients are mixed for 5 to 15 minutes with a Cowles dissolver operating at high sheer, about 100 to 500 rpm), at room temperature. Higher shear rates may be used, but could entrain air. Optionally, the mixture could be degassed in a vacuum (25–29 inches of Hg).

3) At this point, the composition is ready for use. The typical cure schedule for the thermoset resin is:
   a. 20 minutes at 210 degrees F., optionally up to 225 degrees F. Temperatures greater than 250° F. produce undesirable reactions during cure and yield poor quality product. Lower temperatures than 210° F. may be used with longer times.
   b. Depending upon the desired product, a post-cure is often necessary to optimize the electrical properties. One to three hours at 350° F. is preferred.

Examples 1 to 9

The general method of preparing electrical laminates from the resin compositions is as follows. The specific electrical laminates embodied in Examples 1 to 9 were made as indicated below and as further indicated in TABLE 1 which follows below. All laminates are 30 mil dielectric thickness with 18–20% by weight E-glass reinforcement.

1) The ingredients, listed in TABLE 1, are added to a mixing vessel.

2) The ingredients are mixed for 5 to 15 minutes with a Cowles dissolver operating at high sheer, (about 100 to 500 rpm), at room temperature. Higher shear rates may be used, but could entrain air optionally, the mixture could be degassed in a vacuum (25–29 inches of Hg).

3) The mixture is heated to 85–100 degrees Fahrenheit, or any temperature below the point at which the catalyst undergoes considerable decomposition to form free radicals. The resin mixture is heated to facilitate impregnating the reinforcement.

4) The composition is utilized with one of the following processes:
   a. The resin mixture is used to impregnate the reinforcement(s) in the lab according to the method outlined in application No. 08/483,086, now abandoned, incorporated herein by reference. The residence times and temperatures can be found in TABLE 1. It has been discovered, that when using this lamination process, temperatures above 250° F. will produce poor quality laminates, and thus should be avoided.
   b. the resin composition is used to impregnate the reinforcement(s) in the lab according to the same method as above (a), with the following exceptions. Rather than curing the laminate in an oven, the appropriate catalysts and promoters are chosen, and the laminate is left undisturbed and allowed to cure at room temperature for 1 to 24 hours. The catalyst half-life, quantity of catalyst, and type and amount of promoters will dictate the amount of time needed to cure at room temperature. These examples can be found in TABLE 1 under "Room Temp." Cure Method.
   c. Alternately, the composition can impregnate the reinforcement by our patented continuous lamination process, (Barrell et al. U.S. Pat. No. 4,803,022). These examples can be found in TABLE 1 under "Continuous" Cure Method.

5) The laminate is post-cured for 1 hour at 350° F. Post-cure reduces the dissipation factor of the laminate. Therefore, a post-cure is desirable, but not required.

TABLE 1

| Ingredient | Designation | Example 1 | Example 2 | Example 3 | Example 4 | Example 5 | Example 6 | Example 7 | Example 8 | Example 9 |
|---|---|---|---|---|---|---|---|---|---|---|
| | | | | Examples of New Invention | | | | | | |
| Urethane Vinyl Ester | 580-05 | 8.08 | | | | | | | | |
| Isocyanate Vinyl Ester | ITP 1041 | | 15.85 | 26.42 | 26.90 | | | | | |
| Isocyanate Vinyl Ester | ITP 1070 | | | | | 16.14 | 34.25 | 20.54 | 16.54 | 16.79 |
| Monomer | Styrene | 6.88 | 13.50 | 22.50 | 22.02 | 13.21 | 14.68 | 8.81 | 14.08 | 14.30 |
| Monomer | Dibromostyrene | 59.85 | 68.49 | 48.92 | 48.92 | 68.49 | 48.92 | 68.49 | 55.62 | 56.61 |
| Monomer | alpha-methyl styrene | | | | | | | | 2.52 | |
| Kaolin Filler | Translink T-37 | 23.94 | | | | | | | 9.11 | 9.09 |
| Quartz Filler | Novakup 1250-172 | | | | | | | | | |
| Multifuntional Monomer | Divinyl Benzene | | | | | | | | | 1.54 |
| Thickener | Fumed Silica | 0.45 | 1.47 | 1.47 | 1.47 | 1.47 | 1.47 | 1.47 | 1.55 | 1.45 |
| Catalyst | t-butyl peroctoate | 0.50 | 0.49 | 0.49 | 0.49 | 0.49 | 0.49 | 0.49 | 0.48 | 0.20 |
| Catalyst | cummene hydroperoxide | 0.10 | 0.02 | | | | | | | |
| Promoter | copper napthenate | | | | | | | | | |
| Promoter | dimethyl aniline | 0.20 | 0.10 | 0.10 | 0.10 | 0.10 | 0.10 | 0.10 | | |
| Promoter | 12% cobalt soln. | 0.10 | 0.10 | 0.10 | 0.10 | 0.10 | 0.10 | 0.10 | | |
| SUM | | 100.00 | 100.00 | 100.00 | 100.00 | 100.00 | 100.00 | 100.00 | 100.00 | 100.00 |
| | | | | Methods of Manufacturing | | | | | | |
| Cure Method | | Room Temp. | 200° F. 30 min. | 200° F. 30 min. | 200° F. 30 min. | 200° F. 30 min. | 200° F. 30 min. | 200° F. 30 min. | Continuous | Continuous |
| Post Cure | | 1 hr@350° F. | 1 hr@350° F. | 1 hr@350° F. | 1 hr@350° F. | 1 hr@350° F. | 1 hr@350° F. | 1 hr@350° F. | 1 hr@350° F. | 1 hr@350° F. |
| | | | | Properties of New Invention | | | | | | |
| Electrical | | | | | | | | | | |
| 1 MHz Dielectric Constant | | 3.03 | 2.65 | 2.68 | 2.59 | 2.6 | 2.63 | 2.7 | 2.99 | 3.20 |
| 1 MHz Dissipation Factor | | 0.0024 | 0.0043 | 0.0053 | 0.0037 | 0.0029 | 0.0034 | 0.0015 | 0.0034 | 0.0029 |

TABLE 1-continued

|  | Example 1 | Example 2 | Example 3 | Example 4 | Example 5 | Example 6 | Example 7 | Example 8 | Example 9 |
|---|---|---|---|---|---|---|---|---|---|
| Db/inch @ 1 GHz | N/A | N/A | N/A | N/A | N/A | N/A | N/A | 0.0253 | 0.0289 |
| Db/inch @ 5 GHz | N/A | N/A | N/A | N/A | N/A | N/A | N/A | 0.1278 | 0.1249 |
| Db/inch @ 10 GHz | N/A | NA | N/A | N/A | N/A | N/A | N/A | 0.3238 | 0.2774 |
| 2.1 GHz Dielectric Constant | N/A | 3.25 | N/A | N/A | 3.31 | N/A | 2.89 | N/A | 3.15 |
| 2.1 GHz Dissipation Factor | N/A | 0.0046 | N/A | N/A | 0.00298 | N/A | 0.004 | N/A | 0.0041 |
| Mechanical |  |  |  |  |  |  |  |  |  |
| Copper Adhesion | 4.0 | N/A | N/A | N/A | N/A | N/A | N/A | 5.1 | 5.5 |
| % Water Absorption | N/A | N/A | N/A | N/A | N/A | N/A | N/A | 0.05 | 0.06 |
| Thermal |  |  |  |  |  |  |  |  |  |
| Glass Transition Temperature | 123 | 118 | 108 | 138 | 135 | 143 | 132 | 124 | 140 |

NOTES
1 MHz Dielectric Constant and 1 MHz Dissipation Factor are determined by Test Method IPC-TM-650 2.5.5.4
Db/inch is the insertion loss (S21 parameter) of a 50 ohm microstrip transmission. This is an indication of the suitability of the material at microwave frequencies
CURE METHOD
"Continuous" = Continuous lamination method outlined in U.S. Pat. of Barrell et. al.
"Room Temp." = Room temperature cure method outlined in specification
"220° F. 30 min." = lamination method outlined in specification
"Post Cure" = time at temperature in a forced-air convection oven
% Water Absorption obtained by Test Method IPC-TM-650 2.6.2.1
Copper Adhesion Values are in pound per inch width as outlined in Test Method IPC-TM-650 2.4.9
Glass Transition Values are in degree Celsius and are obtained by Test Method IPC-TM-650 2.4.24B Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. An electrical laminate, comprising at least one reinforcement substrate and a crossed linked layer of a thermosetting resin composition comprising
   (a) one or more terminally unsaturated urethanes selected from the group consisting of
      1) one characterized by the formula

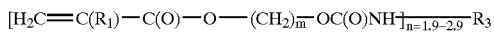

where $R_1$ is H or $CH_3$, m is 2 or 3 and $R_3$ is an organic residue from a diisocyanate or:
      2) one characterized by the formula

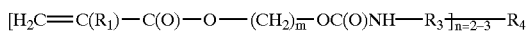

wherein $R_1$, is H or $CH_3$; m is 2 or 3;
      $R_3$ is an organic residue from a diisocyanate; and $R_4$ is an isocyanurate compound of the following formula

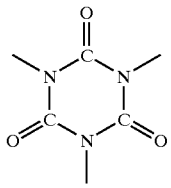

(b) styrene monomer,
   (c) bromostyrene, characterized by the formula

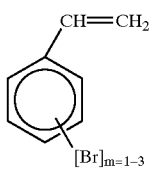

(d) catalysts which induce free radical cure, polymerization, or UV initiation, in about 0.1% to about 2% by weight of the total composition,
   wherein, the ratio of the sum of components (a) to the sum of components (b) and
   (c) is less than 0.2, and the ratio of (b) to (c) is less than 1.5.

2. The laminate of claim 1 which further comprises an electrically conductive cladding.

3. A multilayer electrical laminate comprising the laminate of claim 2.

4. The laminate of claim 3 wherein the unsaturated urethane is formed from a reaction mixture comprising a hydroxypropyl methacrylate and a diisocyanate.

5. The laminate of claim 2, which further comprises a second electrically conductive cladding.

6. The laminate of claim 1, which is characterized by a thickness ranging from about 0.003 to about 0.120 inches.

7. The laminate of claim 1 wherein the terminally unsaturated urethanes of (a)1) comprise a reaction product of 2,4-toluene diisocyanate and hydroxypropyl methacrylate.

8. The laminate of claim 1 wherein said diisocyanate is 2,4-toluene diisocyanate.

9. The laminate of claim 1 wherein the unsaturated urethane is formed from a reaction mixture comprising a hydroxypropyl methacrylate and a diisocyanate.

10. The laminate of claim 1, wherein the one or more terminally unsaturated urethane are formed from a mixture comprising a diisocyanate and a member selected from the group consisting of hydroxyethyl methacrylate; hydroxyethyl acrylate; hydroxypropyl methacrylate and hydroxypropyl acrylate.

11. A laminate for use in electrical applications, comprising at least one reinforcement substrate and a crossed linked layer of a thermosetting resin composition comprising
   (a) one or more terminally unsaturated urethanes selected from the group consisting of
      1) one characterized by the formula

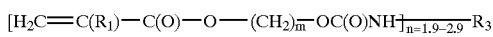

where $R_1$ is H or $CH_3$, m is 2 or 3, and $R_3$ is an organic residue from a diisocyanate, wherein the diisocyanate is selected from the group consisting of 2,4 toluene diisocyanate, 2,6 toluene diisocyanate, 2,4'-diphenylmethane diisocyanate and 2,6'-diphenyl methane diisocyanate or:
      2) one characterized by the formula

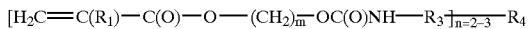

where $R_1$, is H or $CH_3$, m is 2 or 3, and $R_3$ is an organic residue from a diisocyanate wherein the diisocyanate is selected from the group consisting of 2,4 toluene diisocyanate, 2,6 toluene diisocyanate, 2,4'-diphenylmethane diisocyanate and 2,6'-diphenyl methane diisocyanate, and R4 is an isocyanurate compound of the following structure

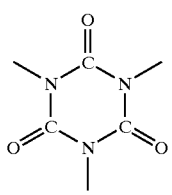

(b) styrene monomer,
   (c) bromostyrene, characterized by the formula

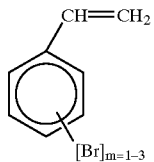

and
   (d) catalysts which induce free radical cure, polymerization, or UV initiation, in about 0.1% to about 2% by weight of the total composition,
   wherein, the ratio of the sum of components (a) to the sum of components (b) and (c) is less than 0.2, and the ratio of (b) to (c) is less than 1.5.

12. The laminate of claim 11, wherein the one or more terminally unsaturated urethane are formed from a mixture comprising a diisocyanate and a member selected from the group consisting of hydroxyethyl methacrylate; hydroxyethyl acrylate; hydroxypropyl methacrylate and hydroxypropyl acrylate.

* * * * *